United States Patent
Kitagawa et al.

(10) Patent No.: US 6,458,201 B2
(45) Date of Patent: *Oct. 1, 2002

(54) APPARATUS FOR PRODUCING SINGLE CRYSTALS AND METHOD FOR PRODUCING SINGLE CRYSTALS

(75) Inventors: Kouji Kitagawa; Kouji Mizuishi, both of Annaka (JP)

(73) Assignee: Shin-Etsu Handotai Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/485,721
(22) PCT Filed: Aug. 18, 1998
(86) PCT No.: PCT/JP98/03649
§ 371 (c)(1), (2), (4) Date: Feb. 15, 2000
(87) PCT Pub. No.: WO99/09237
PCT Pub. Date: Feb. 25, 1999

(30) Foreign Application Priority Data

Aug. 19, 1997 (JP) .............................................. 9-237772

(51) Int. Cl.[7] .............................................. C30B 15/30
(52) U.S. Cl. .............................. 117/13; 117/28; 117/218
(58) Field of Search .............................. 117/28, 218, 13

(56) References Cited

U.S. PATENT DOCUMENTS

| | | | | |
|---|---|---|---|---|
| 3,700,412 A | * | 10/1972 | Higashi et al. | 117/218 |
| 4,784,715 A | * | 11/1988 | Stoll | 117/28 |
| 5,330,729 A | * | 7/1994 | Oda et al. | 117/218 |
| 5,817,176 A | * | 10/1998 | Sung et al. | 117/28 |

FOREIGN PATENT DOCUMENTS

| | | | | |
|---|---|---|---|---|
| EP | WO 89/08731 | * | 9/1989 | 117/28 |
| JP | U-59-160561 | | 10/1984 | |

* cited by examiner

Primary Examiner—Robert Kunemund
(74) Attorney, Agent, or Firm—Oliff & Berridge, PLC

(57) ABSTRACT

There are provided an apparatus for producing single crystals and a method for producing single crystals, which can absorb and eliminate vibration generated by a crucible rotation driving motor, or prevent transmission of the vibration to a melt, or attenuate the vibration in the production of single crystals by the CZ method. The apparatus for producing single crystals comprises a crucible for accommodating a raw material melt, a mechanism for pulling a crystal from the melt, a mechanism for rotating the crucible, and a transfer mechanism for vertically moving the crucible, wherein, in the rotation mechanism for the crucible, a ball spline is used for power transmission between a crucible-supporting shaft and a crucible rotation driving unit, and the crucible rotation driving unit is fixedly installed on a substructure of the apparatus for producing single crystals. Further, single crystals are produced by using the apparatus.

18 Claims, 3 Drawing Sheets

APPARATUS FOR PRODUCING SINGLE CRYSTALS AND METHOD FOR PRODUCING SINGLE CRYSTALS

TECHNICAL FIELD

The present invention relates to an improvement of apparatus for producing single crystals, which apparatus is for producing various crystal materials of semiconductors, dielectric material, magnetic material and the like by the Czochralski method.

BACKGROUND ART

For the production of single crystal materials such as semiconductor silicon single crystals, methods for obtaining them as rod-shaped single crystals by the Czochralski method (referred to as "CZ method" hereinafter) have been widely used so far.

Apparatuses for producing single crystals used for this CZ method usually comprise a crucible for accommodating a raw material melt disposed in a chamber, a support shaft for supporting the crucible, a pulling mechanism for pulling a crystal from the melt, a rotation mechanism for rotating the crucible, and a transfer mechanism for vertically moving the crucible, as well as members in a furnace such as heaters and heat insulating materials disposed in the chamber, so that a single crystal can be produced.

It has been widely known that, when crystal growth is attained by this CZ method, ingredients of the crucible such as quartz crucible for accommodating the raw material for the crystal growth, for example, oxygen, are immixed into the resulting crystals, in addition to those ingredients originally contained in the raw material.

The amount of the impurities to be immixed in the crystal may vary depending on the rotation number of the pulled crystal, the rotation number of the crucible, temperature distribution of the raw material melt and the like. That is, the crystal rotation number affects the convection in the melt, the crucible rotation number affects the oxygen concentration itself in the melt, and the temperature distribution in the raw material melt affects the convection in the melt.

Moreover, since depth of the melt in the crucible gradually decreases as the crystal grows, it must be devised that the melt surface should be controlled to position at a fixed position in order to control the diameter of the growing crystal, and it is necessary to move the crucible upward to secure constant relative locational relationship between the melt and the heaters as the crystal grows. Therefore, many of conventional apparatuses for producing crystals based on the CZ method have been provided with functions for rotating a crucible-supporting shaft as well as vertically moving the crucible. In particular, a rotation-driving unit for the crucible-supporting shaft must also be vertically moved with the crucible-supporting shaft. As shown in FIG. 4, in a conventional apparatus for producing single crystals, for example, the crucible rotation driving unit 26 has been provided on a slider 31 of the mechanism 30 for vertically moving the crucible, which vertically moves with the crucible-supporting shaft 4.

In such a conventional apparatus as mentioned above, the melt surface may be vibrated. Such vibration of the melt surface may leads to disadvantages, that is, the growing single crystal may become a polycrystal, or even it becomes impossible to continue the crystal growth when the situation gets worse. Therefore, the cause for the vibration was investigated, and it has been revealed that vibration of the crucible-supporting shaft constitutes its major cause. That is, vibration is generated by rotation of an electric motor, which is the driving power source for the crucible rotation, this vibration in turn vibrates the mechanism for vertical movement, and this vibration is transmitted to the melt via the crucible-supporting shaft and the crucible.

The present invention has been accomplished in view of such problems, and its object is to provide means for absorbing and eliminating the vibration generated by the crucible rotation driving unit, or preventing transmission of the vibration to the melt, or attenuating the vibration.

DISCLOSURE OF INVENTION

In order to achieve the aforementioned object, the 1st embodiment of the invention relates to an apparatus for producing single crystals by the Czochralski method, the apparatus comprising at least a support shaft for supporting a crucible for accommodating a raw material melt, a pulling mechanism for pulling a crystal from the melt, a rotation mechanism for rotating the crucible, and a transfer mechanism for vertically moving the crucible, wherein a crucible rotation driving unit constituting the rotation mechanism for the crucible is fixedly installed on a substructure of the apparatus for producing single crystals.

When the crucible rotation driving unit consisting of an electric motor and means for speed change and reduction is fixedly installed on the substructure of the apparatus for producing single crystals as defined above, vibration generated by the electric motor constituting the crucible rotation driving unit is absorbed by a fixed end, i.e., the rigid substructure, and attenuated. Thus, the vibration is not substantially transmitted to the melt surface via the crucible-supporting shaft and the crucible. Therefore, the vibration of the melt surface, which may be a cause for generating dislocations in growing single crystal ingots, can be substantially eliminated.

In this case, the term "substructure" of the apparatus for producing single crystals means frames, concrete substructures, substructures of working houses and the like for supporting the apparatus for producing single crystals. It may be any means that can fix the crucible rotation driving unit without being vibrated by the unit, and it is not limited by a literal meaning of the word.

The 2nd embodiment of the invention relates to an apparatus for producing single crystals by the Czochralski method, the apparatus comprising at least a support shaft for supporting a crucible for accommodating a raw material melt, a pulling mechanism for pulling a crystal from the melt, a rotation mechanism for rotating the crucible, and a transfer mechanism for vertically moving the crucible, wherein, in the rotation mechanism for the crucible, a ball spline is used for power transmission between a crucible-supporting shaft and a crucible rotation driving unit, and the crucible rotation driving unit is fixedly installed on a substructure of the apparatus for producing single crystals.

When the crucible rotation driving unit consisting of an electric motor and means for speed change and reduction is fixedly installed on the substructure of the apparatus for producing single crystals, and a ball spline is used for power transmission between the crucible-supporting shaft and the crucible rotation driving unit in the rotation mechanism for the crucible as defined above, only vibration attenuated by being absorbed into the substructure is transmitted to the ball spline, and therefore the vibration of the melt surface is substantially eliminated without affecting at all the function of the ball spline for transmitting rotation simultaneously with the vertical movement. Thus, single crystals can be produced safely and efficiently.

In the 3rd embodiment of the invention, a rubber-like elastic belt and a pulley, or a rubber-like elastic timing belt and a timing pulley are used as means for transmitting rotation between the crucible-supporting shaft and a ball spline shaft, and between a ball spline sleeve and an output shaft of the crucible rotation driving unit.

By using a rubber-like elastomer as a material for transmitting rotation between the shafts as defined above, the vibration generated by the crucible rotation driving unit is attenuated and absorbed by rubber-like elastic deformation, and vibration transmitted to the melt surface is substantially eliminated. Therefore, the cause etc. for generating dislocations in growing crystals is eliminated, and crystals can be produced safely and efficiently.

The 4th embodiment of the invention relates to an apparatus for producing single crystals by the Czochralski method, the apparatus comprising at least a crucible-supporting shaft for supporting a crucible for accommodating a raw material melt, a rotation mechanism for rotating the crucible, and a transfer mechanism for vertically moving the crucible, wherein vibration at the upper end of the crucible-supporting shaft for supporting the crucible is controlled to be 100 $\mu$m or less along a direction perpendicular to the shaft.

In an apparatus for producing single crystals by the Czochralski method, if the vibration at the upper end of the crucible supporting shaft for supporting the crucible is 100 $\mu$m or less along a direction perpendicular to the shaft, vibration of the crucible-supporting shaft directly acting on the whole raw material melt becomes small, and thus the vibration of the raw material melt surface, which is the cause for generating dislocations in growing crystals, can be substantially eliminated.

The expression of "vibration of 100 $\mu$m or less" used for the present invention, for example, means that a rocking range of an object shaken by the vibration is 100 $\mu$m or less, and does not mean that the amplitude of the vibration (half of the rocking range of the shaken object) is 100 $\mu$m or less.

In the above apparatus, as the 5th embodiment, the transfer mechanism is preferably provided with a slider that vertically moves with the crucible-supporting shaft, and vibration of the slider along a direction vertical to the crucible-supporting shaft is preferably controlled to be 200 $\mu$m or less.

When the vibration of the slider is 200 $\mu$m or less, the vibration of the crucible-supporting shaft can be 100 $\mu$m or less. Thus, the vibration of the raw material melt surface, which is the cause for generating dislocations in growing crystals, can be substantially eliminated.

Further, in the above apparatus, as the 6th embodiment, vibration generated by the crucible rotation driving unit, which is a power source for the rotation mechanism, is preferably controlled to be 50 $\mu$m or less.

If the vibration generated by the crucible rotation driving unit is 50 $\mu$m or less as defined above, amplification of the vibration by the crucible transfer mechanism can be prevented, and thus the vibration of the raw material melt surface, which is the cause for generating dislocations or the like in growing crystals, can be substantially eliminated.

Further, as the 7th embodiment of the invention, if single crystals are produced by using the apparatus for producing single crystals according to any one of 1st–6th embodiments, the single crystals can be stably produced without generating dislocations and the like in the single crystals because the vibration of the raw material melt is substantially eliminated.

The 8th embodiment of the invention relates to a method for producing single crystals based on the Czochralski method by supporting a crucible accommodating a raw material melt by a crucible-supporting shaft, and rotating and vertically moving the crucible, wherein the single crystals are produced while vibration at the upper end of the crucible-supporting shaft is controlled to be 100 $\mu$m or less along a direction perpendicular to the shaft.

If single crystals are produced while the vibration at the upper end of the crucible-supporting shaft is controlled to be 100 $\mu$m or less along a direction perpendicular to the shaft, the generation of dislocations and the like in single crystals caused by vibration of the raw material melt can be prevented, and thus the production efficiency of single crystals can be improved.

In the conventional mechanisms for rotating crucible, vibration of the crucible-supporting shaft is transmitted to the melt surface, and it constitutes the cause for generating dislocations and the like in the growing single crystals. In contrast, according to the present invention, by fixing the crucible rotation driving unit on the substructure of the apparatus for producing single crystals, and by using a ball spline and, for example, a timing belt for transmission of rotation, the vibration is absorbed and attenuated, and thus the vibration of the melt surface is substantially eliminated. Therefore, thanks to the elimination of the cause for generating dislocations in growing crystals, single crystals can be produced safely and efficiently.

BRIEF DESCRIPTION OF THE DRAWINGS

FIG. 2A is a front view of the ball spline including a partial sectional view, and FIG. 2B is a sectional view of the ball spline along the line A–B.

BEST MODE FOR CARRYING OUT THE INVENTION

Figure 1:
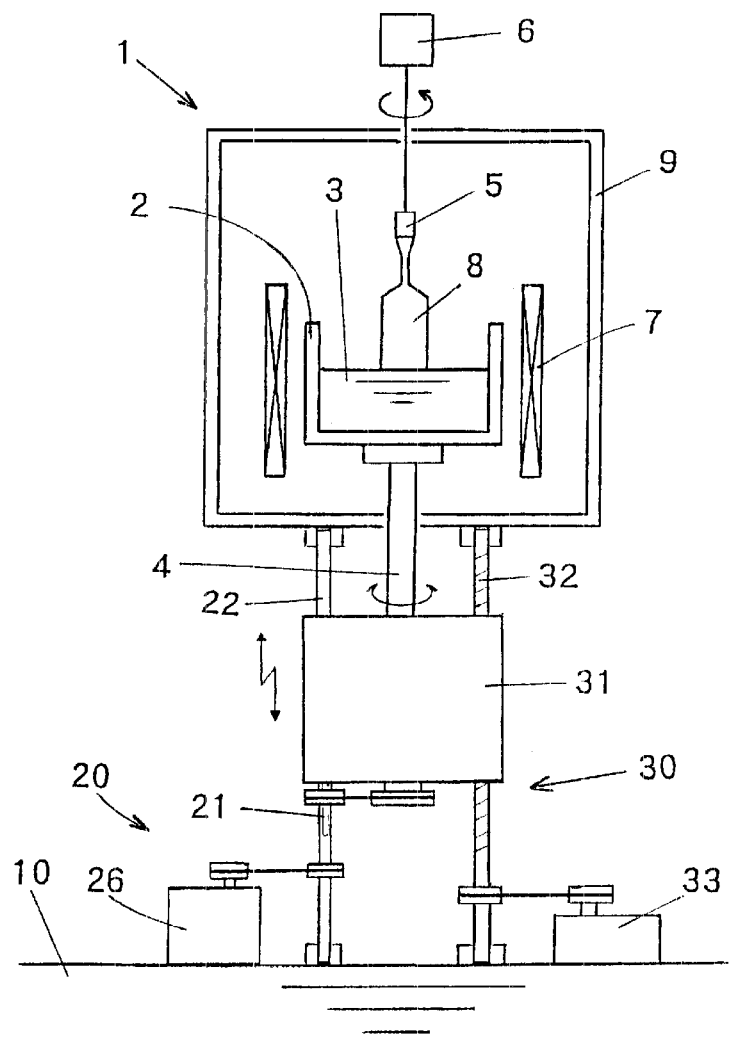
FIG. 1 is an explanatory view representing an exemplary apparatus for producing single crystals according to the present invention.

Hereafter, embodiments of the present invention will be explained in more detail, but the present invention is not limited to these.

The inventors of the present invention found that the vibration observed at a melt surface during the production of single crystals was generated mainly by vibration of a crucible-supporting shaft.

The causes for the generation of vibration at the raw material melt include, in addition to the vibration of the crucible-supporting shaft, inert gas flow flown in the furnace during the crystal growth, rotation of growing crystal, unstationary temperature gradient in the melt, unstationary convection in the melt due to rotation of the crystal and the crucible and the like. These causes act in a complexed manner to vibrate the raw material melt surface during the crystal growth. In particular, the vibration of the crucible-supporting shaft is the most influential since it directly acts on the whole raw material melt via the crucible containing the melt.

Therefore, the inventors of the present invention investigated the relationship between the vibration of the crucible-supporting shaft and vibration of the raw material melt surface, and found that the vibration of the raw material melt surface, which is the cause for generating dislocations and the like in growing crystals, could be substantially eliminated by controlling vibration at the upper end of the crucible-supporting shaft to be 100 $\mu$m or less along a direction perpendicular to the shaft.

The vibration of the crucible-supporting shaft can be controlled to be 100 $\mu$m or less, for example, by controlling the vibration of the slider of the crucible transfer mechanism, which vertically moves with the crucible-supporting shaft, to be 200 $\mu$m or less along a direction perpendicular to the crucible-supporting shaft. Many of apparatuses for rotating and vertically moving the crucible are provided with a slider vertically moving with the crucible-supporting shaft. The vibration transmitted from the crucible rotation driving unit to the slider is absorbed and attenuated during the transmission within the crucible-supporting shaft, and around a half of the vibration of the slider is transmitted to the upper part of the crucible-supporting shaft. Therefore, by controlling the vibration of the slider to be 200 $\mu$m or less, the vibration of the crucible-supporting shaft can be controlled to be 100 $\mu$m or less, and thus the vibration of the raw material melt surface can be substantially eliminated.

The inventors of the present invention further found that the vibration observed at the melt surface during the single crystal production was caused mainly by the vibration generated by the crucible rotation driving unit. For example, as shown in FIG. 4, when the crucible rotation driving unit 26 is mounted on the slider 31, vibration generated by the crucible rotation driving unit 26 is usually absorbed by the slider 31 and attenuated, and it is scarcely transmitted to the melt surface via the crucible-supporting shaft 4 and the crucible 2.

Figure 4:
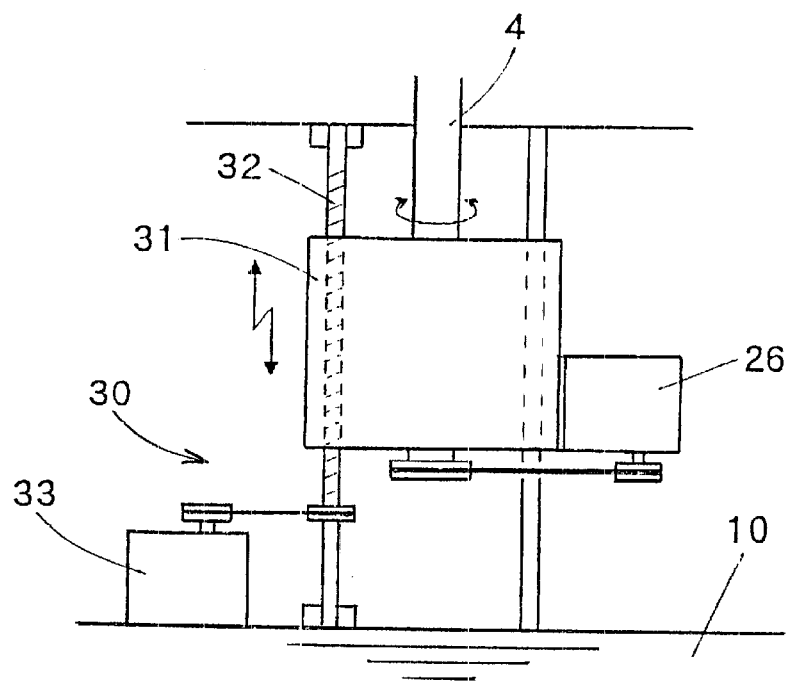
FIG. 4 is an explanatory view representing an exemplary conventional crucible rotation mechanism.

However, since the crucible transfer mechanism 30 must be vertically moved while receiving a load (weight of the crucible 2 and the melt 3) on the slider 31, it is constituted by the crucible-supporting shaft 4, the slider 31, a ball screw 32, and fixed shafts as shown in FIG. 4, and it supports the slider 31 with the ball screw 32 for vertical movement and the several fixed shafts in such a manner that the slider 31 can vertically move. The fixed shafts and the ball screw 32 are fixed at their upper ends and lower ends.

Therefore, when the vibration generated by the crucible rotation driving unit 26 is strong, it cannot be attenuated, and when the slider locates at a particular position, the vibration generated by the crucible rotation driving unit 26 may be markedly amplified.

Figure 5:
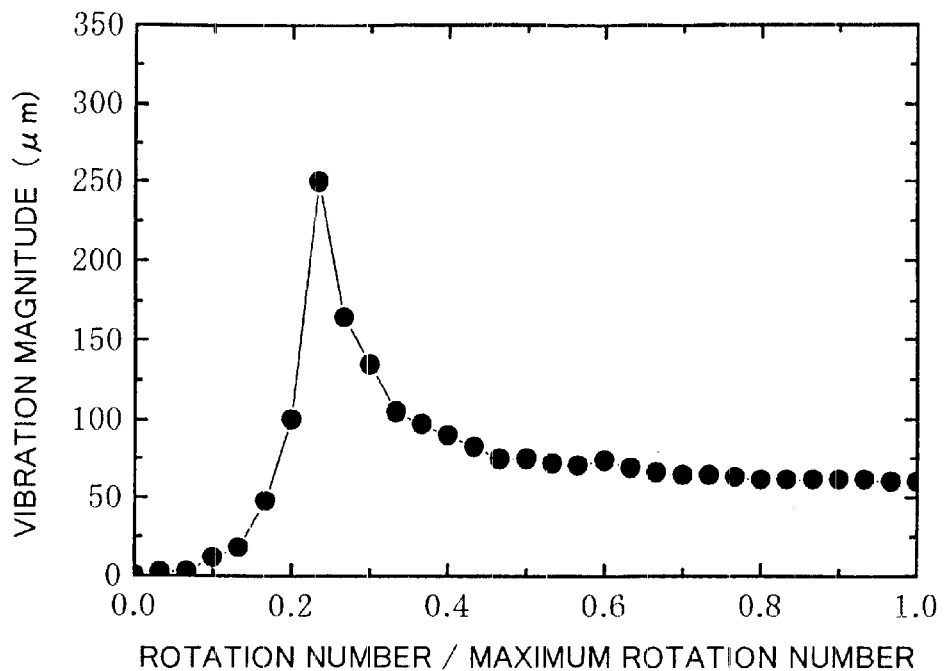
FIG. 5 is a graph representing an example of the mode of vibration generated in a crucible rotation driving unit.
Figure 6:
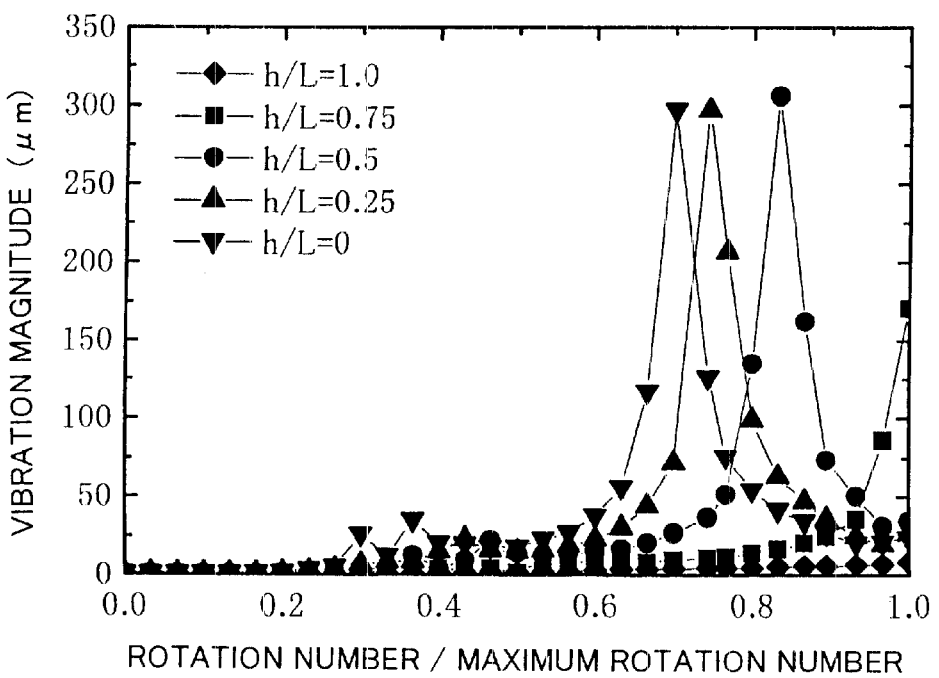
FIG. 6 is a graph representing vibration magnitudes of a slider, on which the crucible rotation driving unit shown in FIG. 5 was mounted.

FIG. 5 represents an example of the mode of vibration generated in a crucible rotation driving unit. Magnitudes of vibration measured at 5 positions on a slider by mounting the crucible rotation driving unit on the slider are shown in FIG. 6. h represents a distance from the lower limit position to the slider, and L represents the full stroke. From FIG. 6, it can be seen that vibration of the slider does not necessarily become stronger when the vibration of the crucible rotation driving unit itself becomes stronger, and the vibration is markedly amplified in a particular rotation range.

Therefore, the inventors of the present invention performed similar measurement by mounting on the slider a crucible rotation driving unit which is devised to generate vibration of 50 $\mu$m or less by changing the combination of the motor and the speed reducer in the crucible rotation driving unit. As a result, marked enhancement of vibration like the one seen in FIG. 6 was not observed.

That is, by controlling the vibration generated by the crucible rotation driving unit to be 50 $\mu$m or less, the amplification of vibration by the crucible transfer mechanism can be eliminated, and thus the vibration of the raw material surface can substantially be eliminated.

The inventors of the present invention further studied means for eliminating the vibration of the crucible rotation driving unit by absorption, or preventing its transmission to the melt surface, or attenuating it. As a result, they found that it is effective for that purpose to fixedly install the crucible rotation driving unit on a rigid substructure of the apparatus for producing single crystals, and accomplished the present invention.

An exemplary crucible rotation mechanism of the apparatus for producing single crystals according to the present invention will be explained first with reference to the appended drawings.

The crucible rotation mechanism of the present invention is a mechanism suitable for suppressing generation of vibration at a melt surface to avoid the generation of dislocations in growing crystals in apparatuses for producing single crystals based on the so-called Czochralski method (CZ method), which are for, for example, growing semiconductor silicon crystals. The basic structure of the apparatus for producing single crystals will be outlined with reference to FIG. 1.

The apparatus 1 for producing single crystals comprises at its center a quartz crucible 2 which accommodates silicon melt 3 and is heated by a heater 7. This crucible 2 can be rotated by a crucible-supporting shaft 4, and moved vertically by the slider 31 supporting the crucible-supporting shaft 4. On the other hand, it also has a structure which enables a seed crystal 5 attached to the lower end of a wire suspended from a mechanism 6 for pulling and rotating the seed crystal to be brought into contact with raw material silicon melt 3 in the crucible 2, and enables a growing single crystal 8 to be pulled while being rotated.

Figure 3:
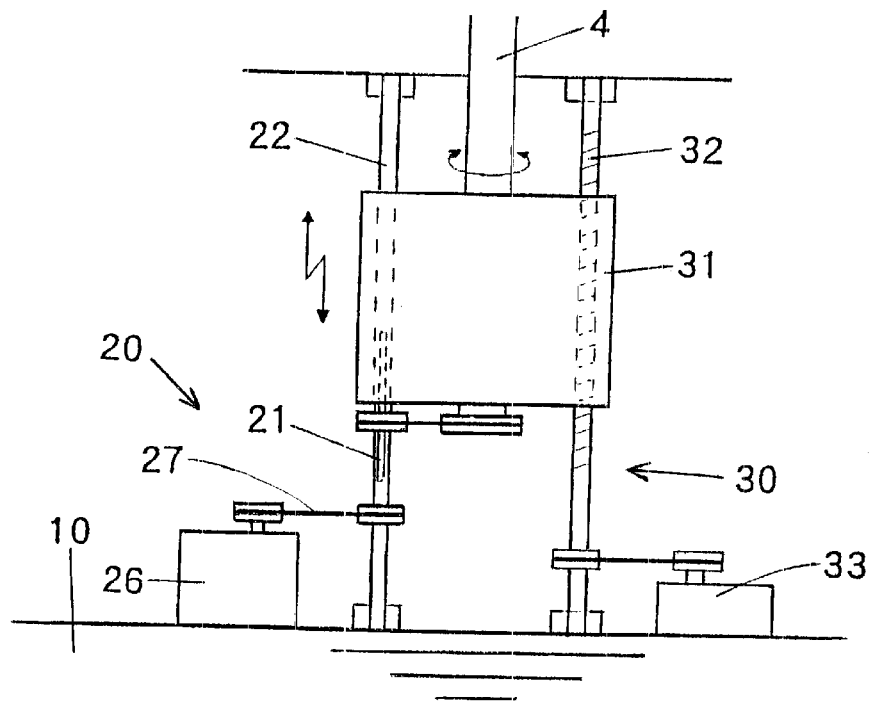
FIG. 3 is an explanatory view representing an exemplary crucible rotation mechanism according to the present invention.

In the apparatus 1 for producing single crystals mentioned above, the crucible rotation mechanism 20 of the present invention comprises a crucible rotation driving unit 26 fixedly installed directly on a substructure 10 of the apparatus for producing single crystals, as shown in FIG. 1 (partial detailed view is shown in FIG. 3.). The rotation of an output shaft of the crucible rotation driving unit 26 is transmitted to an spline shaft 22 of the ball spline 21, and further transmitted to the crucible-supporting shaft 4 through a sleeve.

On the other hand, as shown in FIG. 1 (partial detailed view is represented in FIG. 3.), for example, the mechanism 30 for vertically moving crucible converts the rotation of the output shaft of the crucible transfer driving unit 33 fixed to the substructure 10 into vertical movement of the slider 31 via a ball screw 32, and vertically moves the crucible-supporting shaft 4 directly connected to the slider 31 and the crucible 2. The vibration generated by the driving unit 33 of the crucible transfer mechanism 30 is not substantially transmitted to the melt surface, because any of the components constituting the mechanism are not directly connected to the crucible 2 or the crucible-supporting shaft 4, and it is fixedly installed on the substructure 10.

As shown in FIG. 4, in a conventional crucible rotation mechanism, the crucible rotation driving unit 26 is directly connected to the slider 31 of the crucible transfer mechanism 30 to rotate the crucible-supporting shaft 4. Therefore, vibration generated by the unit 26 is directly transmitted to the crucible-supporting shaft 4, which constitutes the cause for vibration of the melt surface.

According to the present invention, the crucible rotation driving unit 26 consists of an electric motor, a speed reducer, and a speed regulator, and transmits the rotation of the final output shaft to the crucible-supporting shaft 4 via the spline shaft 22 and the sleeve 23 of the ball spline 21. The major cause for the generation of vibration at the melt surface in the crucible is the vibration generated by the rotation power source, i.e., an electric motor. As the first means for suppressing this vibration, according to the present invention, the crucible rotation driving unit 26 is attached and fixed on, for example, a base frame 10 that is directly fixed to the substructure of the apparatus for producing single crystals, so that low frequency vibration, in particular, should be absorbed by working houses and the like via the base frame 10.

The crucible rotation mechanism 20 of the present invention smoothly transmits the rotation of the crucible rotation driving unit 26 to the crucible-supporting shaft 4 while following the vertical movement of the slider 31, thanks to the use of the ball spline 21.

Thus, the ball spline receives only the vibration attenuated by being absorbed into the substructure, and the vibration of the melt surface can be substantially avoided without affecting the function of the ball spline for simultaneously transmitting vertical movement and rotation at all. Therefore, single crystals can be produced safely and efficiently.

Figure 2A:
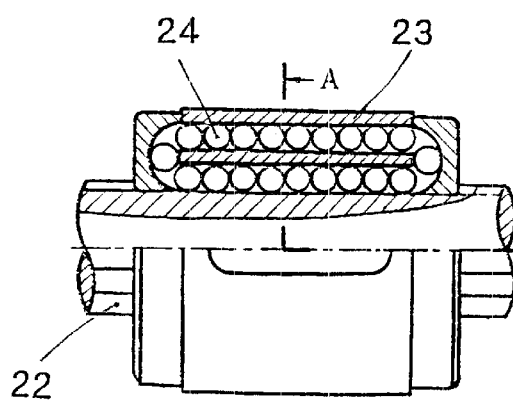
FIG. 2A and FIG. 2B are explanatory views of an exemplary ball spline used for the mechanism for rotating crucible according to the present invention.
Figure 2B:
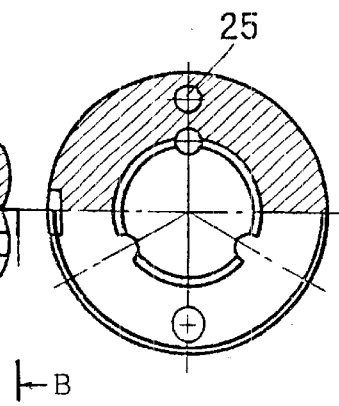

As the ball spline 21, a radial type ball spline as shown in FIG. 2 may be usually used. The ball spline 21 has slots of semicircle shape, which contain many steel balls 24, in both of the spline shaft 22 and sleeve 23 along the shaft direction, and it enables torque transmission between the shaft 22 and the sleeve 23, and very smooth movement along the shaft. While the sleeve 23 has a return hole 25 in the example shown in FIG. 2, one having a device for holding the balls instead of the return hole may also be used.

Further, in order to realize smooth rotation power transmission and vertical movement of the ball spline 21, and suppress the vibration generated by the output shaft of the crucible rotation driving unit 26, a combination of a rubber-like elastic belt (flat belt, V belt) and a pulley, more preferably a combination of a rubber-like elastic timing belt 27 and a timing pulley is used for rotation transmission between the three shafts, i.e., the output shaft of the crucible rotation driving unit 26, the ball spline shaft 22, and the crucible-supporting shaft 4.

In such a structure, because the belt, timing belt and the like are mainly composed of a rubber-like elastomer, they relax stress by elastic deformation, absorb or attenuate the vibration generated by crucible rotation driving unit 26, alleviate vibration load on the ball spline 21, and ultimately substantially eliminate the transmission of vibration to the melt surface in the crucible 2.

The present invention is not limited to the embodiments described above. The above-described embodiments are mere examples, and those having the substantially same structure as that described in the appended claims and providing the similar functions and advantages are included in the scope of the present invention.

For example, while the above-mentioned embodiments mainly concern the cases where the crucible rotation driving unit is fixed on a substructure of the apparatus for producing single crystals, the present invention is not limited to them, and any apparatuses realizing the vibration at the upper end of the crucible-supporting shaft of 100 μm or less fall within the scope of the present invention.

Furthermore, while the crucible rotation mechanism according to the present invention for preventing vibration of the melt surface in the crucible was explained for an apparatus utilizing the CZ method, the present invention can of course be used for those utilizing the so-called MCZ method (pulling method under magnetic field)

What is claimed is:

1. An apparatus for producing single crystals by the Czochralski method, wherein the apparatus comprises at least a support shaft for supporting a crucible for accommodating a raw material melt, a pulling mechanism for pulling a crystal from the melt, a transfer mechanism for vertically moving the crucible, and a rotation mechanism for rotating the crucible, of which a crucible rotation driving unit is fixedly installed directly on a substructure of the apparatus for producing single crystals.

2. The apparatus for producing single crystals according to claim 1, wherein, in the rotation mechanism for the crucible, a ball spline is used for power transmission between a crucible-supporting shaft and a crucible rotation driving unit.

3. The apparatus for producing single crystals according to claim 2, wherein a rubber-like elastic belt and a pulley, or a rubber-like elastic timing belt and a timing pulley are used as means for transmitting rotation between the crucible-supporting shaft and a ball spline shaft, and between a ball spline sleeve and an output shaft of the crucible rotation driving unit.

4. An apparatus for producing single crystals by the Czochralski method, the apparatus comprising at least a crucible-supporting shaft for supporting a crucible for accommodating a raw material melt, a rotation mechanism for rotating the crucible, and a transfer mechanism for vertically moving the crucible, wherein vibration at an upper end of the crucible-supporting shaft for supporting the crucible is controlled to be 100 μm or less along a direction perpendicular to the shaft.

5. The apparatus for producing single crystals according to claim 4, wherein the transfer mechanism is provided with a slider that vertically moves with the crucible-supporting shaft, and vibration of the slider is controlled to be 200 μm or less along a direction vertical to the crucible-supporting shaft.

6. The apparatus for producing single crystals according to claim 4, wherein vibration generated by the crucible rotation driving unit, which is a power source for the rotation mechanism, is controlled to be 50 μm or less.

7. The apparatus for producing single crystals according to claim 4, wherein vibration generated by the crucible rotation driving unit, which is a power source for the rotation mechanism, is controlled to be 50 μm or less.

8. A method for producing single crystals based on the Czochralski method, wherein the single crystals are produced by using the apparatus for producing single crystals according to claim 1.

9. A method for producing single crystals based on the Czochralski method, wherein the single crystals are pro- 9. duced by using the apparatus for producing single crystals according to claim 2.

10. A method for producing single crystals based on the Czochralski method, wherein the single crystals are produced by using the apparatus for producing single crystals according to claim 3.

11. A method for producing single crystals based on the Czochralski method, wherein the single crystals are produced by using the apparatus for producing single crystals according to claim 4.

12. A method for producing single crystals based on the Czochralski method, wherein the single crystals are produced by using the apparatus for producing single crystals according to claim 5.

13. A method for producing single crystals based on the Czochralski method, wherein the single crystals are produced by using the apparatus for producing single crystals according to claim 6.

14. A method for producing single crystals based on the Czochralski method, wherein the single crystals are produced by using the apparatus for producing single crystals according to claim 7.

15. The apparatus for producing single crystals by the Czochralski method according to claim 1, wherein a face of the crucible rotation driving unit is in direct contact with the substructure.

16. The apparatus for producing single crystals by the Czochralski method according to claim 15, wherein the face of the crucible rotation driving unit and the apparatus are both in direct contact with the same surface of the substructure.

17. The apparatus for producing single crystals by the Czochralski method according to claim 1, wherein the substructure is a single piece.

18. A method for producing single crystals based on the Czochralski method by supporting a crucible accommodating a raw material melt by a crucible-supporting shaft, and rotating and vertically moving the crucible, wherein the single crystals are produced while vibration at an upper end of the crucible-supporting shaft is controlled to be 100 $\mu$m or less along a direction perpendicular to the shaft.

* * * * *